(12) United States Patent
Pitts

(10) Patent No.: US 6,292,422 B1
(45) Date of Patent: Sep. 18, 2001

(54) READ/WRITE PROTECTED ELECTRICAL FUSE

(75) Inventor: Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/469,689

(22) Filed: Dec. 22, 1999

(51) Int. Cl.$^7$ ...................................................... G11C 7/00
(52) U.S. Cl. ................................ 365/225.7; 365/189.12; 365/96
(58) Field of Search ........................... 365/225.7, 189.12, 365/96, 221

(56) References Cited

U.S. PATENT DOCUMENTS

| | | |
|---|---|---|
| 4,647,340 | 3/1987 | Szluk et al. . |
| 4,852,044 | 7/1989 | Turner et al. . |
| 5,384,746 | 1/1995 | Giolma . |
| 5,661,323 | 8/1997 | Choi et al. . |
| 5,671,183 | 9/1997 | Soenen et al. . |
| 5,912,579 | 6/1999 | Zagar et al. . |
| 5,991,220 * | 11/1999 | Freyman .......................... 365/225.7 |
| 6,002,620 * | 11/1999 | Tran ................................. 365/225.7 |
| 6,088,281 * | 7/2000 | Miyakawa ........................ 365/225.7 |

* cited by examiner

Primary Examiner—A. Zarabian
(74) Attorney, Agent, or Firm—April M. Mosby; W. James Brady; Frederick J. Telecky, Jr.

(57) ABSTRACT

A system and method is provided for storing a data value by implementation of electrical fuses. Typically, the electrical fuses are provided in a fuse array broken up into a plurality of fuse chains addressable by a control logic circuit. The control logic circuit provides control signals for serially loading data values into the chain. Preferably, the control logic circuit also provides control signals for testing and programming of the loaded data values in addition to subsequently reading the loaded data values. A chain can include a plurality of sub-chains. Each chain or sub-chain includes optional write protection fuse cells, optional read protection fuse cells and at least one data fuse cell. Preferably, one of the optional write protection fuse cells is located first in the chain or sub-chain and one of the optional read protection fuse cells is located last in the chain or sub-chain. Programming of the optional write protection fuse cell prohibits subsequent programming of the chain or sub-chain, while programming of the optional read protection cell prohibits serial reading of the chain or sub-chain. Additionally, each data cell is provided with an output that is readable by a host system or device in which the chain or sub-chain is integrated.

17 Claims, 13 Drawing Sheets

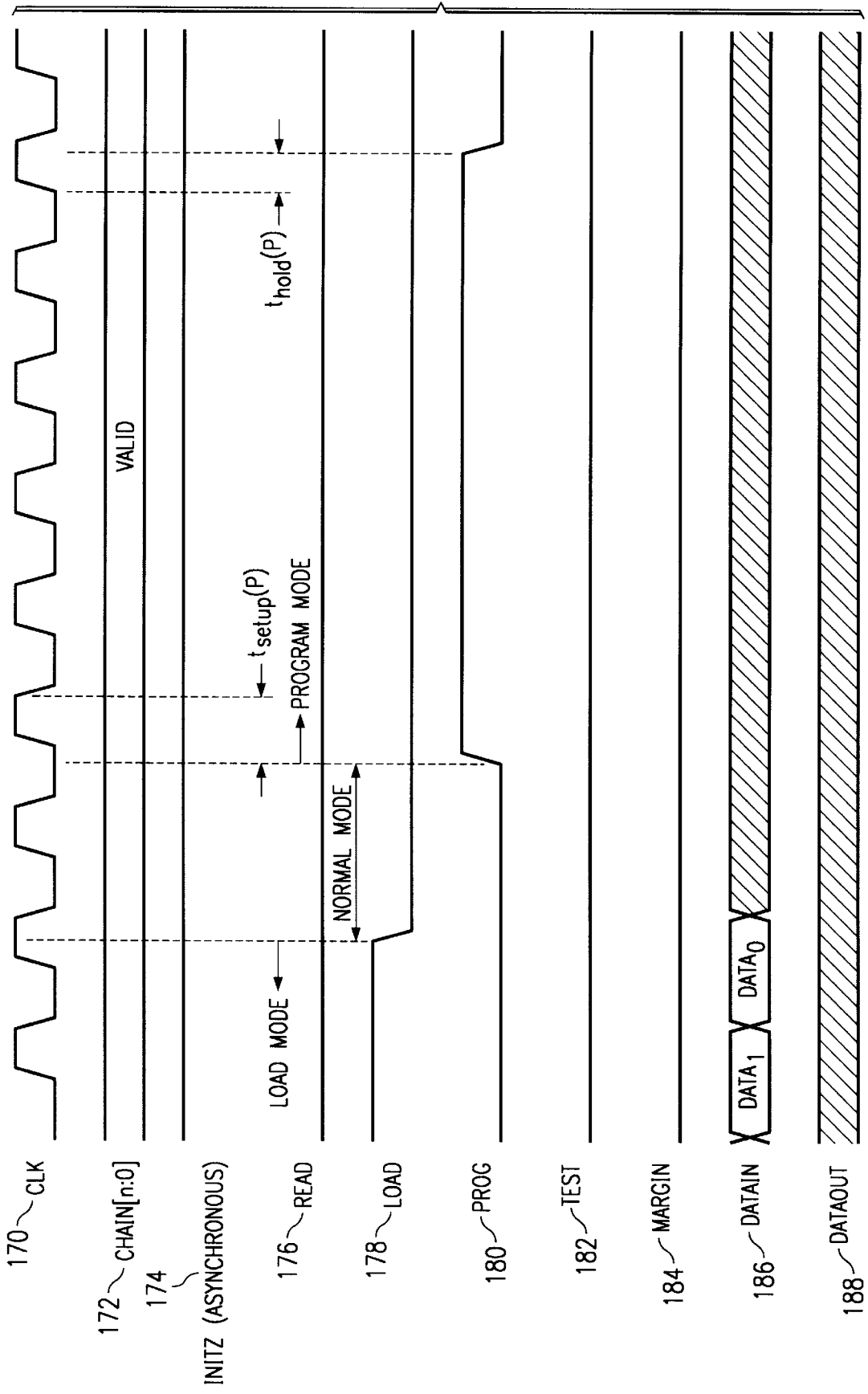

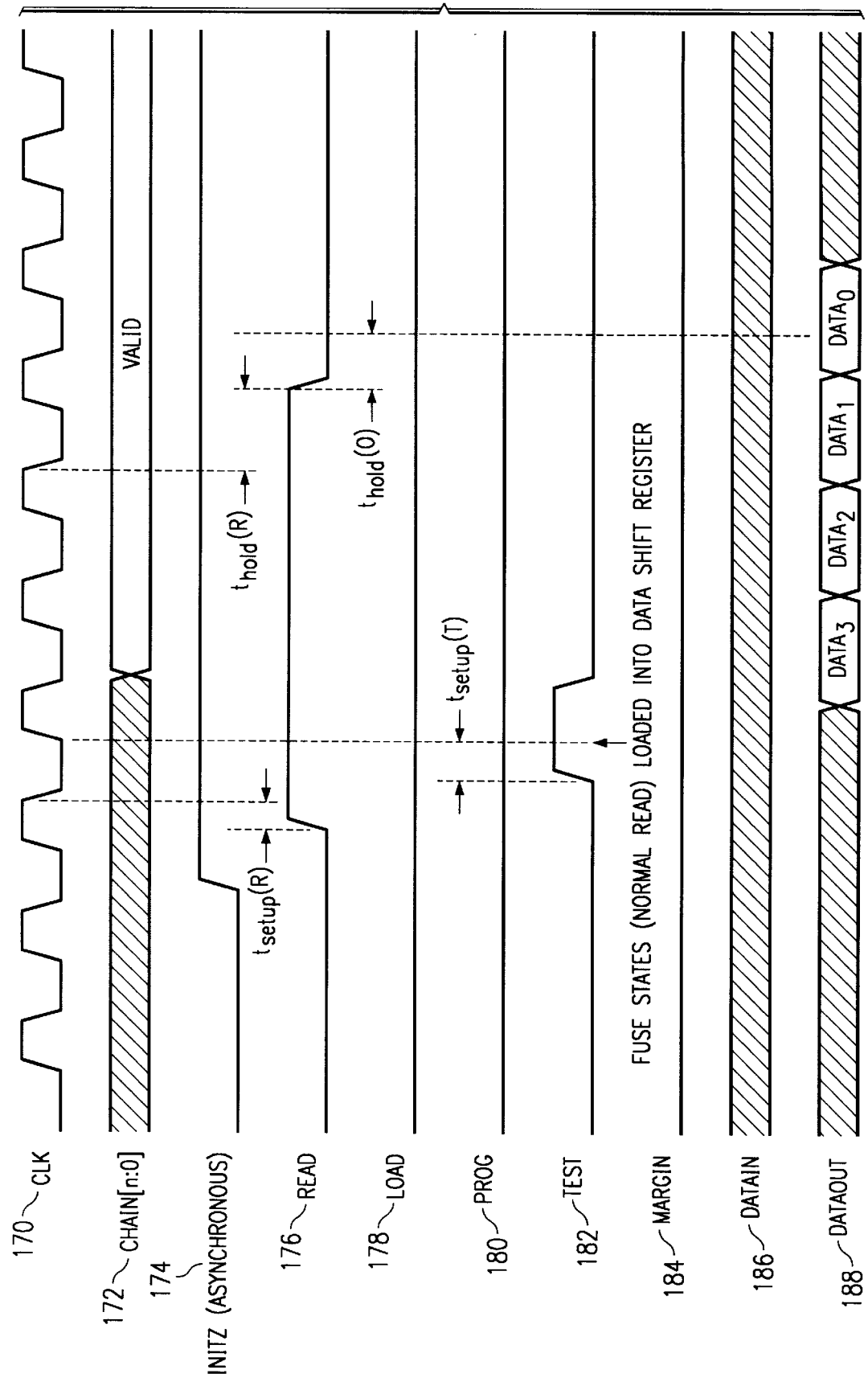

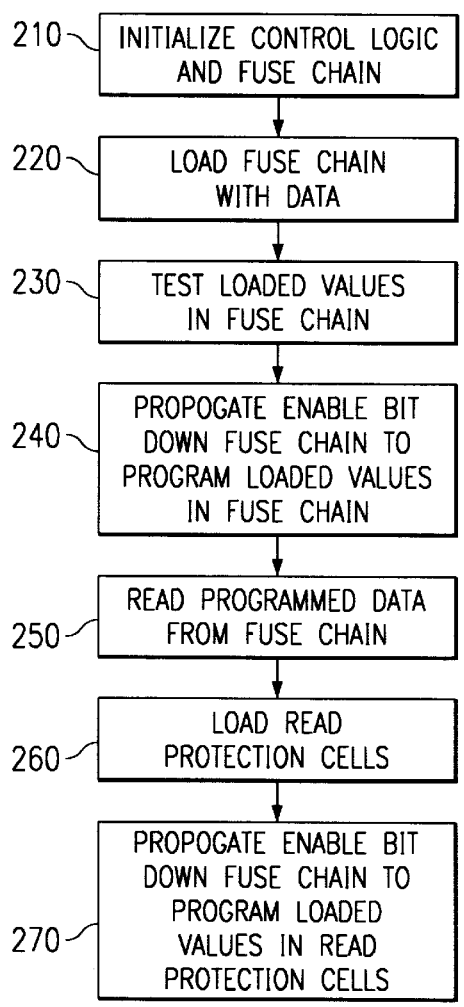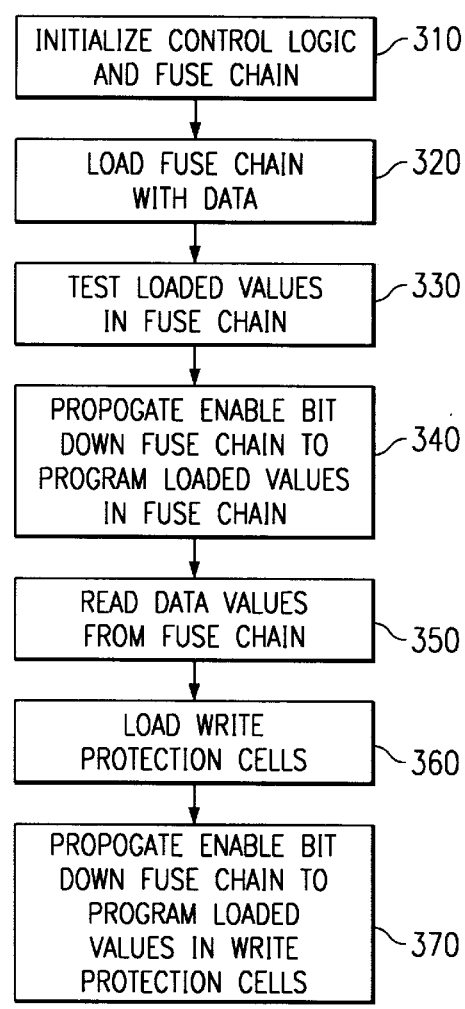

READ/WRITE PROTECTED ELECTRICAL FUSE

TECHNICAL FIELD

The present invention relates to electrical fuses, and more particularly to a system and method for programming an electrical fuse chain that includes read and write protection capabilities.

BACKGROUND OF THE INVENTION

Laser blown fuses historically have been used in logic processes for memory redundancy control and die identification. In some technologies the laser blown fuses are being replaced by electrically programmable fuses. An electrical programmable fuse cell contains an electrically programmable element and sense circuit such that its output may be permanently set to a logic '1' instead of its natural unprogrammed state, a logic '0' or vice-versa. These electrically programmable fuse cells could be used for not only memory redundancy control and die identification, but also for analog trimming control, customer owned configuration bits, encryption key coding, in addition to a variety of other applications.

Presently, electrically programmable fuses have to be customized to a particular application. For example, if a manufacturer wants to provide a set of write protected fuses for die identification, the manufacturer will integrate the fuses into a design and provide a probe pad that is not coupled to an external pin when the wafer is packaged into an integrated circuit. This prohibits the customer from overwriting the fuse data. Customer specific fuses will then be provided via a separate pin on the integrated circuit for programming by the customer. In another situation, a manufacturer may want to provide fuses with confidential information for use by the device within which the fuses have been integrated. The manufacturer would have to fabricate custom fuses into the device that include outputs accessible to circuitry within the device and not the customer to provide read protection of the information. Although this has been sufficient for programming a limited number of electrically programmable fuses, it becomes quite cumbersome when programming a large number of electrically programmable fuses across different devices that may be integrated into a single integrated circuit. In addition, providing multiple pads and pins wastes die and board space. Furthermore, in certain applications, such as calibration, it is undesirable to be limited to either a pad or pin programming method because of changes in parameters from the wafer stage to the package stage.

The present art has not provided an electrically programmable fuse arrangement that provides the manufacturer and customer with read protect, write protect, and test capabilities. The present art also has not provided an electrically programmable fuse arrangement that can be utilized across multiple devices in a large scale application, while allowing for either pin or pad access programming. Accordingly, there is a strong need in the art for a system and/or method for providing a programmable electrical fuse device that allows for write and/or read protection across a variety of different applications.

SUMMARY OF THE INVENTION

According to a preferred embodiment of the present invention, a system and method is provided for storing data values by implementation of electrical fuses. The present invention provides for a combination of electrical fuse cells, control, and connectivity which enables the programming and use of electrical fuses for diverse product applications, such as memory redundancy control, analog trimming control, customer owned configuration bits, die identification, encryption key coding, etc. The electrical fuses are provided in a fuse array and are broken up into one or more fuse chains which are addressable by a control logic circuit. The control logic circuit provides control signals for serially loading data values into the fuse chains. The control logic circuit also provides control signals for testing and programming of the loaded data values in addition to subsequently reading the programmed data values. A fuse chain may also include a plurality of sub-chains. Each fuse chain or sub-chain includes an optional write protection fuse cell, an optional read protection fuse cell and at least one data fuse cell.

Each data cell in a fuse chain or sub-chain includes a first flip flop or shift register element that allows for programming of the sub-chain by serially loading the data downstream through the chain or sub-chain. Once each of the protection cells and data cells are loaded in the chain or sub-chain, a high program enable bit ("1") is propagated through a second flip flop or shift register element disposed in each cell. Propagation of the high bit ensures that the high current necessary for programming of a cell fuse is provided to each cell in the chain or sub-chain one at time, so that undesirable constraints are not placed on the system power source or signal routing resistance. Preferably, the optional write protection fuse cell is located first in the chain or sub-chain and the optional read protection fuse cell is located last in the chain or sub-chain. Programming of the optional write protection fuse cell prohibits subsequent programming of downstream fuses in the chain or sub-chain, while programming of the optional read protection cell prohibits serial reading of upstream fuses in the chain or sub-chain. Additionally, each data cell is provided with an output that is optionally readable by a host system or device within which the chain or sub-chain is integrated.

The present invention allows a manufacturer to program a manufacturing code into a fuse sub-chain that cannot be accessed or altered in any way by a customer. The customer can then program a customer code in a different fuse sub-chain which can subsequently be protected against further modification. The data can also be programmed to not be accessible to anyone other than a host device. This allows for not only programming of the fuse values in integrated circuits by wafer probing, but allows for the same security in an integrated circuit package form. Due to the fact that the fuse data values are serially loaded, tested, programmed, and read, a fuse chain can be implemented across a variety of devices integrated onto a single integrated circuit or device. In addition, the electrical fuse is designed to be universal in that it requires no additional photomasks for a basic single gate oxide CMOS process. The laser fuse process typically requires an additional photomask.

Thus, according to one aspect of the present invention, an electronic system is provided that includes an electronic device and a fuse chain integrated into the electronic device. The fuse chain includes at least one protection fuse cell and at least one data fuse cell operably coupled to the at least one protection fuse cell.

In accordance with another aspect of the present invention, a circuit is provided for storing a data value. The circuit includes an optional write protection fuse cell, an optional read protection fuse cell and at least one data fuse cell disposed between and operably coupled to the optional write protection fuse cell and the optional read protection fuse cell.

In accordance with yet another aspect of the present invention, a data storing methodology is provided. The methodology includes the steps of providing a fuse chain including at least one protection fuse cell and at least one data fuse cell, loading a data value serially into the fuse chain and programming the loaded data value into the fuse chain.

In accordance with yet another aspect of the invention, a method is provided for storing a data value. The method includes the steps of providing a plurality of fuse cells, each fuse cell including a data shift register element and a program enable shift register element wherein the data shift registers of each cell are electrically coupled serially and the program enable shift registers of each cell are electrically coupled serially. The method further includes loading a data value serially into the data shift registers of the plurality of fuse cells and propagating an enable bit serially through the program enable shift registers to cause fuse cells having a program bit in their data shift register to be programmed one at a time.

In accordance with yet another aspect of the invention, a fuse chain for storing a data value is provided including a plurality of serially arranged fuse cells. Each fuse cell includes a data shift register element and a program enable shift register element wherein the data shift registers of each cell are electrically coupled serially and the program enable shift registers of each cell are electrically coupled serially. The data shift registers are adapted to propagate a data value through the cell chain until each cell is loaded with a data bit. The program enable shift registers are adapted to propagate an enable bit serially through the fuse chain to program each cell individually containing a program bit in their respective data shift register.

In accordance with another aspect of the present invention, a fuse chain for storing a data value is provided. The fuse chain includes at least one data fuse cell for storing the data value, means for write protecting the at least one data fuse cell and means for read protecting the at least one data fuse cell.

To the accomplishment of the foregoing and related ends, the invention, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

BRIEF DESCRIPTION OF THE DRAWINGS

FIG. 8c illustrates a timing diagram for programming a loaded fuse chain in accordance with one aspect of the present invention;

FIG. 8d illustrates a timing diagram for reading a programmed fuse chain in accordance with one aspect of the present invention;

FIG. 10 illustrates a flow chart of one particular methodology of programming an optional read protection cell in accordance with one aspect of the present invention; and FIG. 11 illustrates a flow chart of one particular methodology of programming a programmable protection cell in accordance with one aspect of the present invention.

DETAILED DESCRIPTION OF THE INVENTION

The present invention will now be described with respect to the accompanying drawings in which like numbered elements represent like parts. The present invention will be described with reference to a system and method for providing and programming a fuse cell chain. The fuse cell chain could include one or more optional write protection cells or could include one or more read protection cells. The fuse cell chain could include both write protection cells and read protection cells. The fuse chain can be loaded, tested, programmed, and read serially. The programming of the cell can be performed by propagating a single enable bit through the chain causing programming of each cell in the chain to occur individually to limit constraints on a power supply used in programming the cells. It should be understood that the description of these preferred embodiments are merely illustrative and that they should not be taken in a limiting sense.

Figure 1:
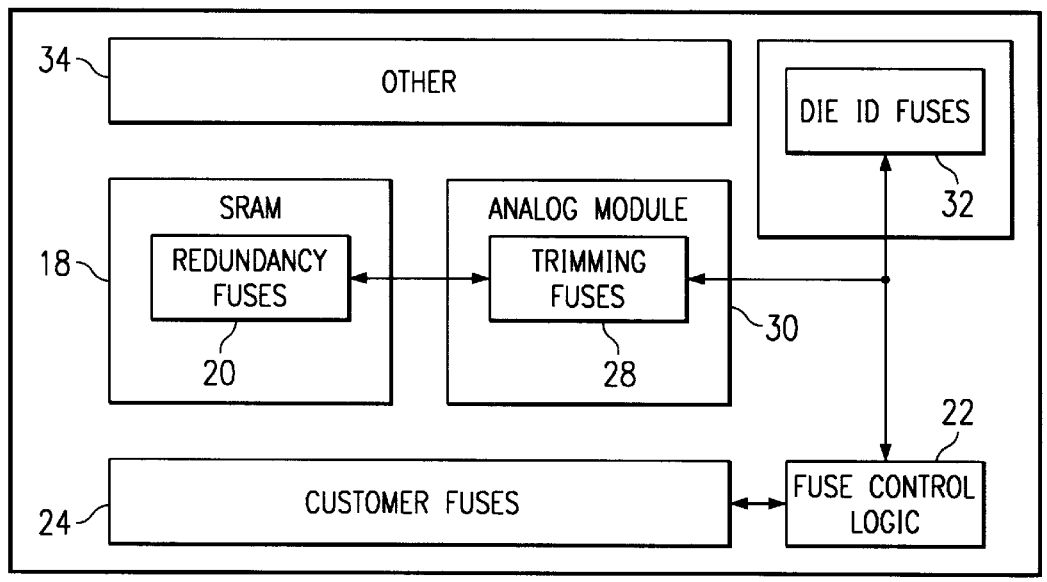
FIG. 1 illustrates a block diagram of a device with integrated electrical fuse arrays in accordance with one aspect of the present invention.

Referring now to FIG. 1, an electronic system 10 illustrating an exemplary environment of particular interest to the present invention is provided. The electronic system 10 includes a static random access memory (SRAM) device 18, a fuse control logic device 22, an analog module 30, and a device labeled other 34. The electronic system 10 illustrates various exemplary implementations of electrical fuses; for example, the SRAM device 18 uses redundancy fuses 20 in the event of a failure of any of the memory cells within the SRAM device 18 to cause redundant memory cells to be mapped as replacements for failed memory cells.

The analog module 30 utilizes trimming fuses 28 for analog trimming control of analog devices within the analog module 30. In addition, the electronic system 10 includes customer fuses 24 for setting customer owned configuration bits. Finally, the electronic system 10 includes die identification fuses 32 that allows for die identification. An encryption key coding block is not shown in this example. The fuse control logic 22 generates appropriate signals which allow loading, programming, reading, and testing of the various fuse implementations illustrated in FIG. 1. It is to be noted that serial programming of the various electrical fuse chains allows for programming of electrical fuses in one element of one chain simultaneously (e.g. redundancy fuses 20, trimming fuses 28, and die ID fuses 32) to minimize the power supply and signal routing requirements. It is to be appreciated that the present invention facilitates programming and testing of the electrical fuses in either a wafer or package form by utilizing serial loading, testing, and programming.

Figure 2:
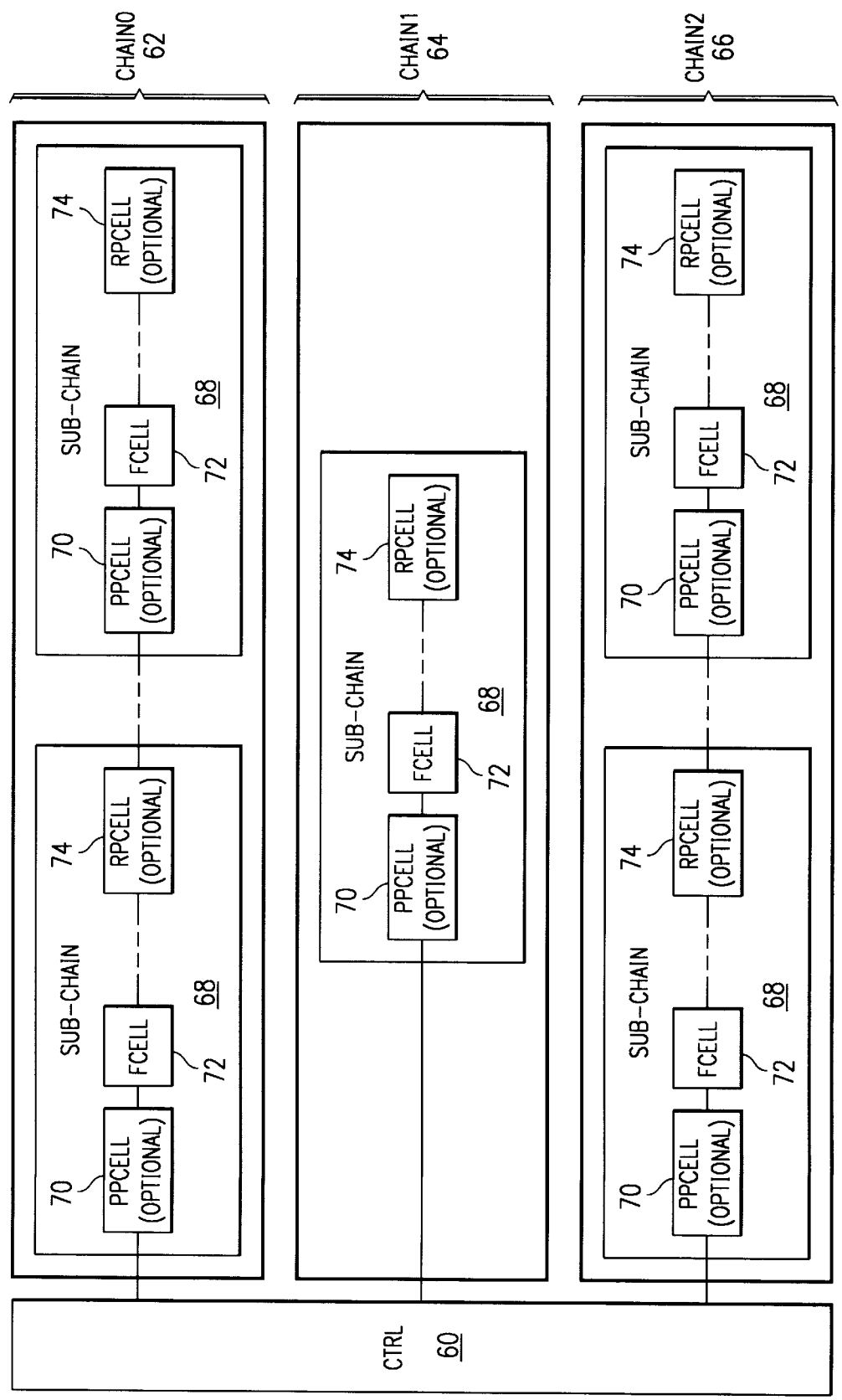
FIG. 2 illustrates a block diagram of a fuse implementation in accordance with one aspect of the present invention.

FIG. 2 illustrates a preferred electrical fuse implementation of the present invention utilizing a controller 60, similar in operation to the fuse control logic circuit 22 illustrated in FIG. 1, and a plurality of sub-chains 68 arranged in a serial manner along different chains. Each chain (CHAN0) 62, 64 (CHAN1), and 66 (CHAN2), allows for serial loading, testing and programming of the sub-chains 68 along a given chain. In a preferred embodiment of the invention, a sub-chain 68 includes a data fuse cell (FCE) 72, an optional program protection cell (PPCE) 70 or optional write protection cell, and an optional read protection cell (RPCE) 74. The fuse and protection cells are connected together in one or more serial chains allowing for sequential loading of desired fuse data, programming of the loaded data, and reading of the fuse states. The control circuit generates the signals required to load, program and read the fuse and protection cells.

Each cell 70, 72, and 74, contains an electrically alterable fuse. In addition, each cell includes supporting circuitry for programming the cell and propagating signals along the fuse chain. In addition, each data fuse cell 72 includes an output that can be used by a host device, within or outside the device in which the fuse chain is integrated, for specific applications (e.g. memory redundancy control, die identification, analog trimming, etc.). The optional program protection cell 70 is similar to the data fuse cell 72, except that once the optional program protection cell 70 is programmed, it prohibits programming of any subsequent downstream cells within the chain in which the cell 70 resides. In addition, the optional read protection cell 74 is similar to the data fuse cell 72, except that once the optional read protection cell 74 is programmed, it prohibits reading of any chain elements upstream to the programmed read protection cell 74 within the chain in which the cell 74 resides. In one aspect of the invention, programming of the optional read protection cell 74 also prohibits programming of downstream fuses or protection cells. Although the protection cells (e.g. optional program protection cell 70 and optional read protection cell 74) are programmable in a manner similar to the data fuse cells 72, they do not have a usable output to a host device.

It is to be appreciated that multiple fuse chains may be implemented to allow protection of data fuse cells 72 on a chain by chain basis. Each sub-chain 68 may begin, with, end with or contain optional protection cells 70, 74. The protection cells 70, 74 may be utilized to prohibit the modification of critical data such as die identification or memory redundancy control. It is possible, for example, for a manufacturer to utilize a subset of the chains in a particular implementation. A chain or sub-chain can be programmed and locked by programming a protection cell at the beginning of each chain or sub-chain by the manufacturer. Subsequently, a customer cannot alter the specific chains programmed by the manufacturer, but may modify another set of chains or sub-chains for their own purposes. This can be repeated for a number of suppliers and customers involved in the selling of the programmed device. Therefore, the present invention affords for the capability for sub-chain distribution to be optimized based on system requirements. It is to be appreciated that providing an optional read protection cell at each end of or within each chain or sub-chain can be programmed to prevent reading of the data contained within a chain or sub-chain. This provides a mechanism for customer programmed encryption keys, for example, as the key data may be utilized within the implementation device or host, but not be made available at a system or device output port, an important security feature. Optionally, the fuse sub-chains may be accessible in both wafer probe and package forms.

In a preferred embodiment of the invention, the controller 60 includes a processor and a programmable logic device for loading, testing, programming and reading of the various chains and sub-chains. The processor is programmed to control and program the various fuses within the chains and sub-chains in order to carry out the various functions described herein. The processor can be any of a plurality of processors or controllers. The manner in which the processor can be programmed to carry out the functions relating to the present invention will be readily apparent to those having ordinary skill in the art based on the description provided herein.

Figure 3A:
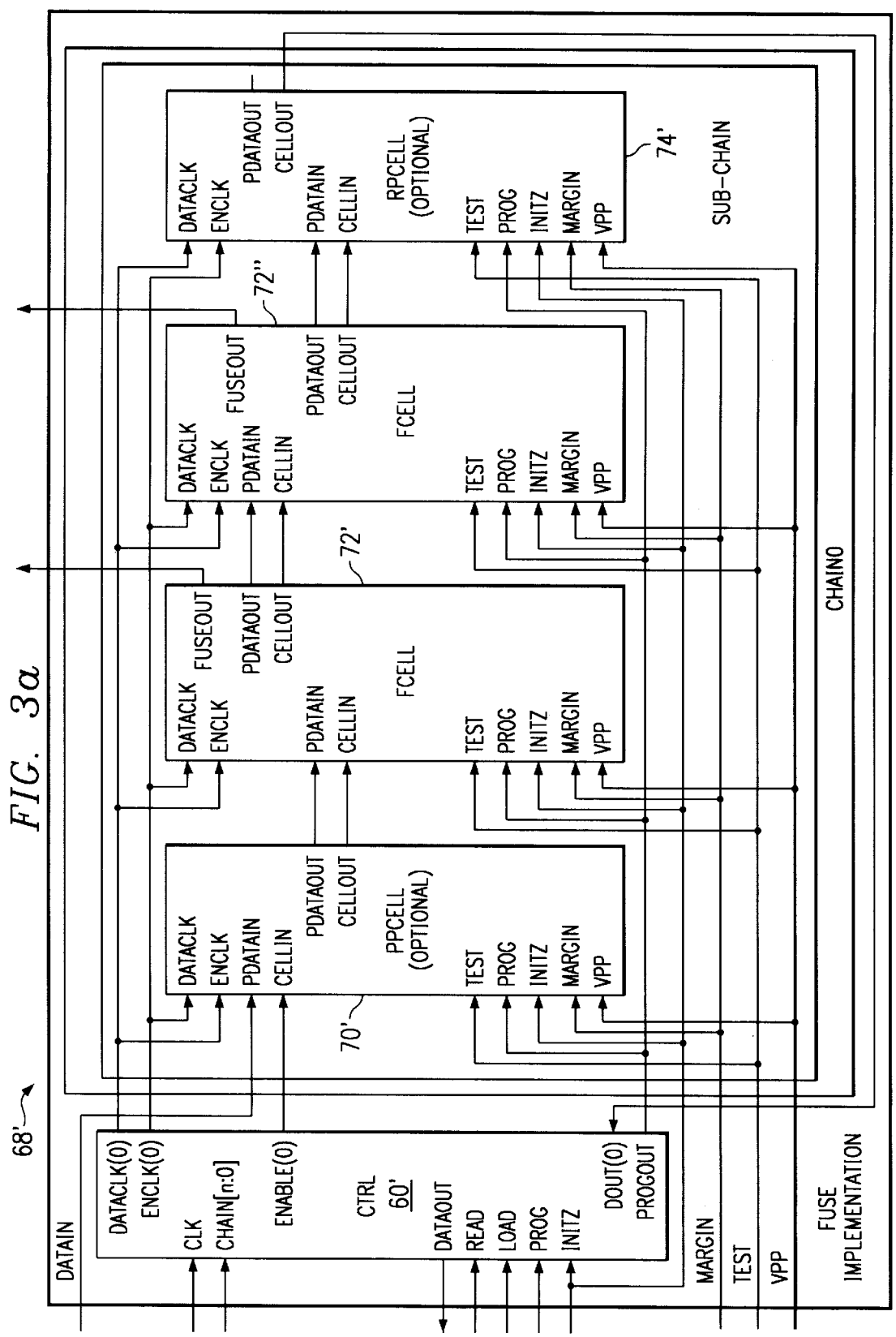
FIG. 3a illustrates a block diagram of a fuse sub-chain in accordance with one aspect of the present invention.

FIG. 3a illustrates a more detailed view of an alternate electrical fuse sub-chain 68' in accordance with the present invention. The sub-chain 68' includes a control logic circuit 60' in a serial arrangement with a program (write) protection cell 70', a first data fuse cell 72', a second data fuse cell 72', and an optional read protection cell 74'. The control logic circuit 60' can be a variety of logic devices, such as an erasable programmable logic device (EPLD), a programmable logic array (PLA), test equipment, or the like. The control logic circuit 60' receives data and control signals from a processor (not shown) and provides sub-chain status data to the processor. The processor provides the control logic circuit 60' with the appropriate control signals and clock signal for carrying out various functions described herein. Several modes of operation may be supported by the control logic circuit 60' including: Initialization, Normal, Read, Load, Program, Margin Read and Soft Test. These modes can be enabled by controlling one or a combination of the various signals shown in FIG. 3a, mainly, INITZ, READ, PROG, LOAD, TEST and MARGIN. However, typically only initialization and normal modes are utilized once the fuses have been programmed and tested.

The fuse chain implementation signals will now be described with more particularity. The fuse chain includes the following inputs: CHAIN[n:0]; CLK; DATAIN; DATAOUT; INITZ; LOAD; MARGIN; PROG; READ; TEST; and VPP and the following outputs: FUSEOUT(72') and FUSEOUT(72"). The CHAIN[n:0] signal is the address specific to the particular chain being accessed for data loading, programming, or reading. The CLK signal is the fuse implementation clock for scanning in data, programming, or reading out data during testing. The DATAIN signal provides data to the addressed fuse chain for subsequent programming into the fuse cells.

The DATAOUT signal provides the output data from the addressed chain for the read mode. In read mode, the DATAOUT signal reflects whether the fuse has been successfully programmed or not. A host device can determine when the complete chain has been programmed by counting the number of clock cycles while DATAOUT is high. The INITZ signal initializes the control circuit 60' when it is active low. When the INITZ signal becomes inactive (goes high) in normal operation, the fuse element outputs are captured in their respective latches and the fuse cells go into a no power mode. The INITZ signal is also used to preset the control circuit 60' for other modes of operation coming out of initialization. IDDQ testing is optionally performed when INITZ is inactive high as the fuse sensing circuits are active when INITZ is low.

The LOAD signal allows loading of the desired addressed chain with desired fuse data from DATAIN when LOAD is active high. The MARGIN signal enables margin reading of the fuse and protection cell states when it is active high during initialization. The MARGIN signal enables a more stringent read requirement, as opposed to the typical read operation. The PROG signal enables the programming of the fuse and protection cells when it is active high. The READ signal enables reading or margin reading of the fuse and protection cells when it is active high. The TEST signal, when it is active high, causes the fuse cell outputs to become the values loaded during the load operation for testing of the desired fuse configuration before permanently programming the fuses. This feature is called soft testing.

The FUSEOUT(72') and FUSEOUT(72") signals are the output of the data fuse cells readable by a host device. Typically, this value is a logic '1' if programmed and a logic '0' if not programmed, although the opposite polarity may be utilized. The VPP signal provides high programming current to the fuse elements. After programming is complete and during normal operation of the fuse, the voltage magnitude of VPP is the same as the supply voltage (VS) used to power the fuse circuitry and the control logic circuit 60'.

Figure 3B:
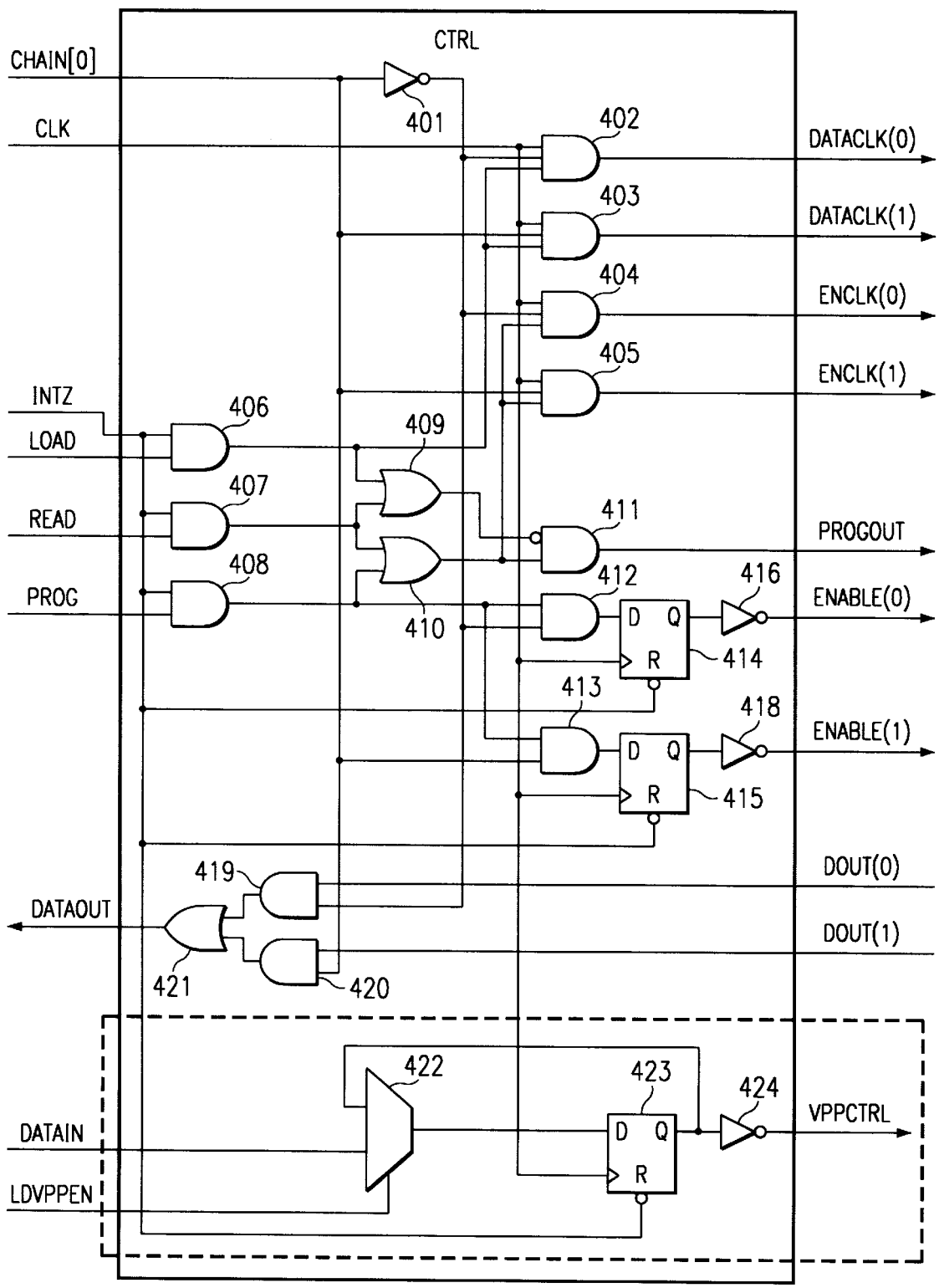
FIG. 3b illustrates a schematic diagram of a control circuit in accordance with one aspect of the present invention.

FIG. 3b illustrates an exemplary schematic logic diagram of the control logic circuit 60' that may be utilized in implementing the present invention. The schematic logic diagram is meant to illustrate an example and therefore details of each component will be omitted for the sake of brevity. However, the operation of the components will be apparent to those skilled in the art. Although, the example is illustrated for the purpose of programming two fuse chains, it is to be appreciated that any number of fuse chains could be programmed by adding additional like components, which would be apparent to those skilled in the art of logic design. In a preferred aspect of the invention, the programming may be performed using a generator to address the number of fuse chains in any given fuse implementation. Referring back to FIG. 3b, the signals needed for the fuse implementation and not needed by the control circuit 60' bypass the control circuit and are routed directly to the fuse chains. For example, these signals include TEST, MARGIN, VPP, and DATAIN. If wafer probe pads are to be implemented in the programming of the fuse chains, the components and signals shown in dashed lines may be implemented to generate a VPPCTRL signal, utilized in programming the wafer. This allows VPP pads to be probed, but not bonded to package pins in a device.

Figure 4:
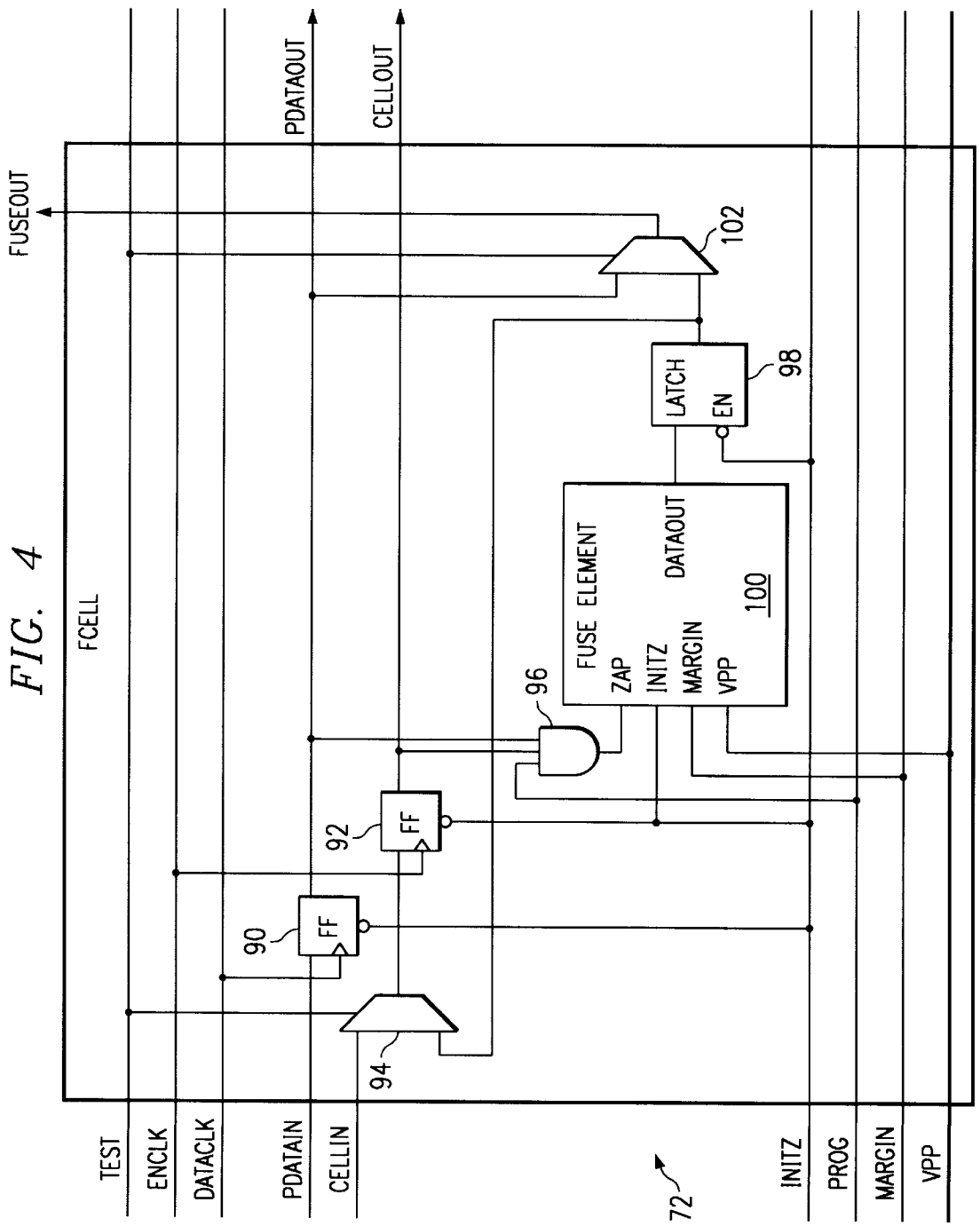
FIG. 4 illustrates a schematic diagram of a data fuse cell in accordance with the present invention.

FIG. 4 illustrates an example of the data fuse cell 72 in greater detail. The data fuse cell 72 includes a first flip flop 90, a second flip flop 92, a first multiplexer 94, and a second multiplexer 102. The first flip flop 90 or data shift register component operates to propagate serial data downstream through the fuse sub-chain or chain. The second flip flop 92 or program shift register component operates to propagate a high signal for individually programming cells one at a time that have been loaded with a program bit in the data shift register 90. The first multiplexer 94 provides the second shift register 92 with a program enable bit through the CELLIN signal during a program operation and provides the second shift register 92 with the output state of a fuse element 100 via a latch circuit 98 during a read operation. The data fuse cell 72 also includes an AND gate 96 that provides a program signal to the fuse element when PDATAIN, PROG and the CELLOUT signal is logic high '1'. According to a preferred embodiment of the present invention, each cell is programmed one at a time so that the high current necessary for programming the each cell does not produce an undesirable overcurrent effect on the power source (e.g. VPP). The above logic allows the fuse element 100 to be interfaced to the signals required for fuse cell operation, including reading, loading, testing, programming and access by a host device.

The data fuse cell 72 receives the following inputs: CELLIN, DATACLK, ENCLK, INITZ, MARGIN, PDATAIN, PROG, VPP, and TEST. CELLIN is an enable signal which gets propagated along the chain to enable the active element in a program mode. When CELLIN is high, during the rising edge of ENCLK, and the fuse or protection cell's data output is active, the program mechanism may be engaged. Otherwise, the data output is inactive and the program mechanism cannot be engaged. It is to be appreciated that only one data fuse cell or protection cell preferably will be programmed in a chain at a time due to the high current required for programming of each cell. During a read operation the CELLIN signal contains data from the previous fuse or cell in the chain or sub-chain.

The rising edge of a DATACLK signal propagates the desired fuse data from the cell input PDATAIN to its output PDATAOUT via the flip flop 90. Once the data has been clocked into each fuse or protection cell, the DATACLK signal is disabled and the data remains available for use within the cell, preferably during a subsequent test or program operation. The rising edge of the ENCLK signal propagates the program enable signal from the input CELLIN to its output CELLOUT via the flip flop or program register 92. The state of PDATOUT determines whether the cell is active or passive during program or read operations. When the INITZ signal is low, it enables fuse element sensing or margin sensing. PROG enables the active cell to be programmed if the cells loaded data PDATAOUT is '1', while TEST multiplexes loaded data to the FUSEOUT signal when PROG is active high. VPP provides the necessary high current for programming the fuse element 100.

The data fuse cell 72 includes the following outputs: CELLOUT, FUSEOUT, and PDATAOUT. The CELLOUT signal propagates the program enable signal to the next cell in the chain or sub-chain. During read operations this output contains the logic states of the fuse or protection cell. This is accomplished by enabling the TEST signal causing the logic state of the data fuse cell or protection fuse cell to be multiplexed by the multiplexer 94 to the program shift register 92. This provides the logic state to the output CELLOUT of the fuse cell. This data can be read serially by pulsing the ENCLK signal. The FUSEOUT signal is the state of the fuse element in normal operation. This value is latched into a transparent latch on the deactivation of initialization. The PDATAOUT signal is data output which is made available to the next cell in the fuse chain.

An alternate embodiment of the fuse or protection cells includes two or more fuses per cell enabled, the programming of which would be controlled by additional control signals. The additional fuses would be used as redundant elements if the fabrication or fuse programmation process yield is inadequate for production. If the cells contain multiple fuses then the design would reflect an appropriate logic state based on the configuration of the fuses, sensing circuit, and whether or not one or more fuses are programmed.

Figure 5:
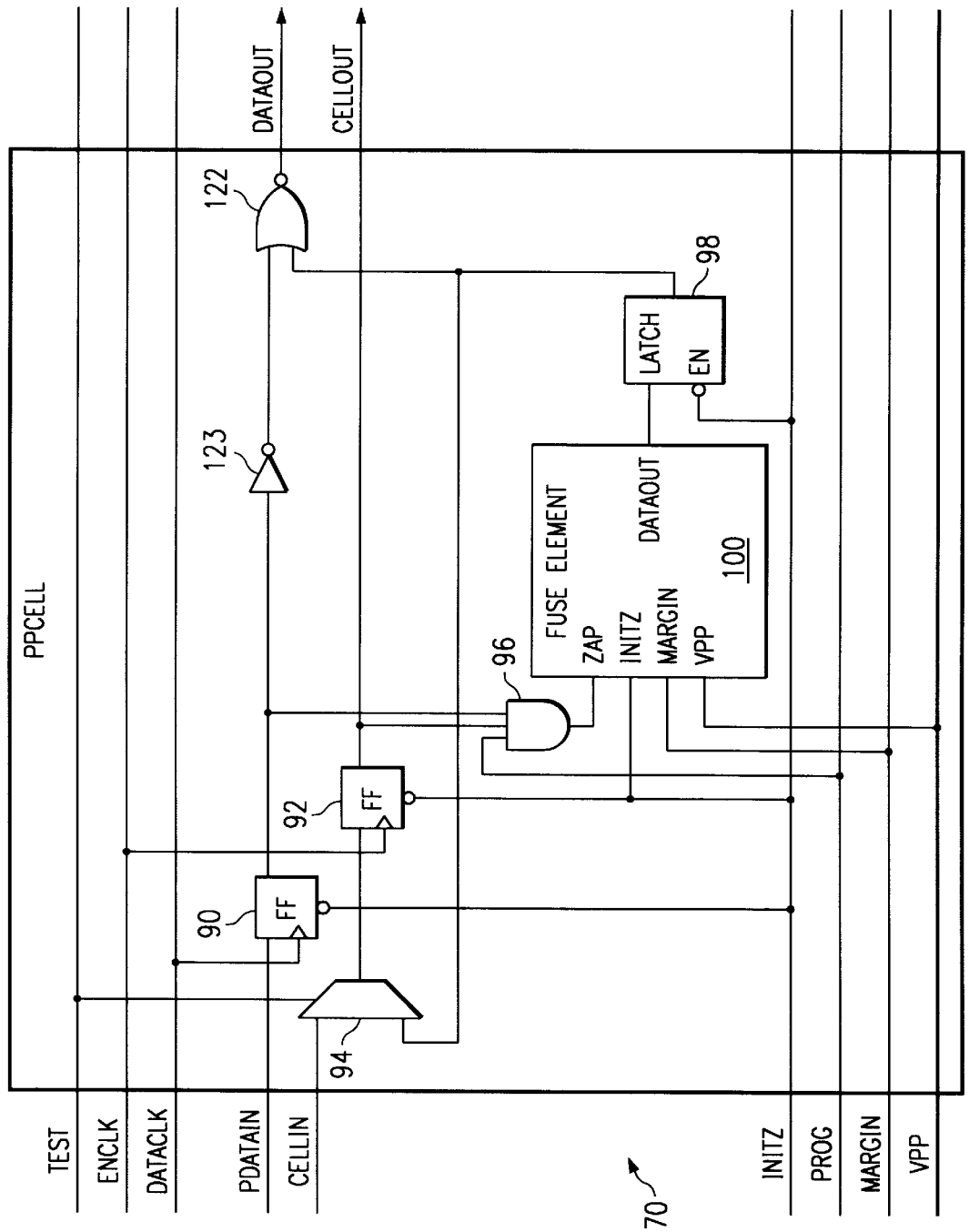
FIG. 5 illustrates a schematic diagram of a programmable (write) protection fuse cell in accordance with the present invention.

FIG. 5 illustrates an example of the optional program protection cell 70 in greater detail. An optional program protection cell contains a fuse element and supporting circuitry which allows a write protection mechanism, depending on the cell's placement in a chain. The optional program protection cell 70 has no effect on the fuse chain when it is not programmed other than being an element in the chain. However, once the optional program protection cell 70 is programmed, all subsequent fuse or protection cells in the chain or sub-chain can no longer be altered. This allows for placement of optional program protection cells within chains or sub-chains to provide optimum write protection. The optional program protection cell 70 is similar to the data fuse cell 72 of FIG. 4 were like parts are denoted with like reference numerals, except that it includes an inverter 123 coupled to a NOR gate 122 and does not include the second multiplexer 102. Furthermore, the behavior of the optional program protection cell 70 is similar to the data fuse cell 72, except for two differences. The optional program protection cell 70 does not have an output usable by a host device, and it also can prevent the propagation of data required to program downstream fuse or protection cells in the chain or sub-chain. In the shown embodiment, since the optional program protection cell does not have an output usable by a host device, the second multiplexer 102 is unnecessary and therefore eliminated. Programming of the optional program protection cell 70 prohibits the propagation of data from the input PDATAIN to the output PDATAOUT. This is accomplished by the NOR gate 122. The NOR gate 122 has a first input coupled to the output state of the fuse element 100 via the latch enable circuit 98 and a second input coupled to the inverted output state of the data register 90 via the inverter 123. When the output of the fuse element 100 is low, a high or low signal at the output of data register 90 will correspond to a high or low being available at the output of the NOR gate 122 (i.e. DATAOUT). However, when the output of the fuse element 100 is high, the output of the NOR gate 122 (i.e. DATAOUT) regardless of the state of the data register 90 is low. Prohibiting the propagation of data through the data shift registers 90 also prevents the soft testing of the fuse chain because soft testing requires serial reading of the data shift registers 90. It is appreciated that this can be an important feature if the chain contains encryption keys, which a user would not want to be bypassable.

Figure 6:
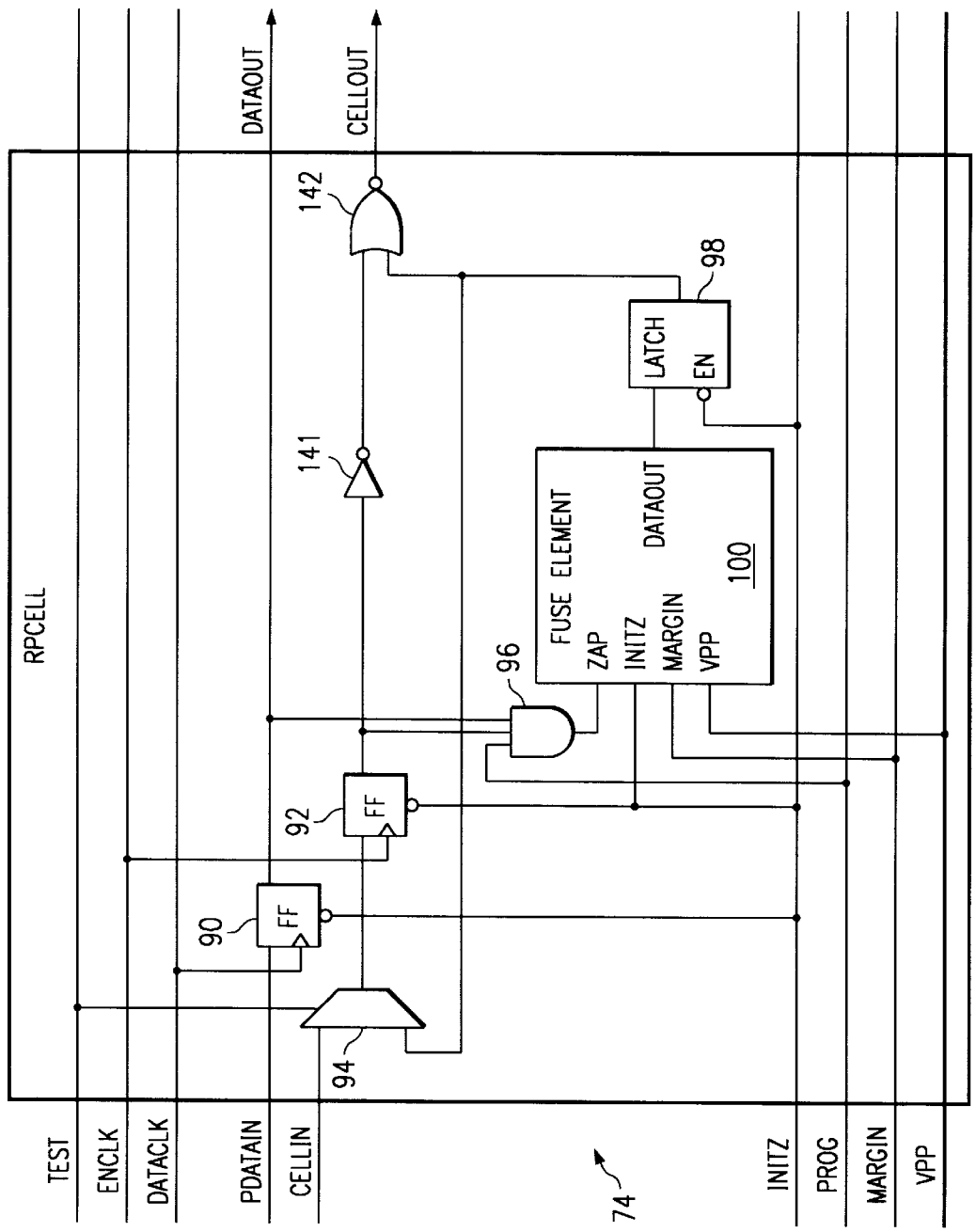
FIG. 6 illustrates a schematic diagram of an optional read protection fuse cell in accordance with the present invention.

FIG. 6 illustrates an example of the optional read protection cell 74 in greater detail. An optional read protection cell 74 contains a fuse element and supporting circuitry which allows both read and write protection, depending on the cell's placement in a chain or sub-chain. The optional read protection cell 74 has no effect on the fuse chain when it is not programmed other than being an element in the chain. However, once the optional read protection cell is programmed, all of the subsequent cells in the chain can no longer be programmed, and all of the fuse or protection cells before the optional read protection cell in the chain can no longer be read. This allows for placement of optional read protection cells within chains or sub-chains to provide desired security. Typically, the last cell of each sub-chain requiring security should be an optional read protection cell. The optional read protection cell 74 is similar to the data fuse cell 72 were like parts are denoted with like reference numerals, except that it includes an inverter 141 coupled to a NOR gate 142 and does not include the second multiplexer 102. Furthermore, the behavior of the optional read protection cell 74 is similar to the data fuse cell 72 except for two differences. The optional read protection cell 74 does not have an output usable by a host device, and it also prevents the propagation of data to the control block during a read or margin read. In addition, it further prevents the propagation of the enabling bit for a program operation.

Since the optional read protection cell 74 does not have an output usable by a host device, the second multiplexer 102 is unnecessary and therefore eliminated. Programming of the optional read protection cell 74 prohibits the propagation of the program enable pulse from the input CELLIN to the output CELLOUT. In addition, programming of the optional read protection cell 74 prohibits the propagation of the programmed state of the fuse cell 100 via the latch circuit 98 multiplexed to the program register 92 by the multiplexer 94 during a read operation. This is accomplished by the NOR gate 142. The NOR gate 142 has a first input coupled to the output state of the fuse element 100 via the latch enable circuit 98 and a second input coupled to the inverted output state of the program register 92 via the inverter 141. When the output of the fuse element 100 is low, a high or low signal at the output of program register 92 will correspond to a high or low output being available at the output of the NOR gate 142 (i.e. CELLOUT). However, when the output of the fuse element 100 is high, the output of the NOR gate 142 (i.e. CELLOUT) will be low regardless of the state of the program register 92. Due to the fact that the shifting element is also used to propagate the program enable bit during program operation, this cell also prevents programming downstream fuse or protection elements. However, unlike the optional program protection cell 70, the optional read protection cell 74 does not prohibit soft testing of the fuse chain cells that are subsequent to an optional read protection cell even though it does prevent programming of them.

Figure 7:
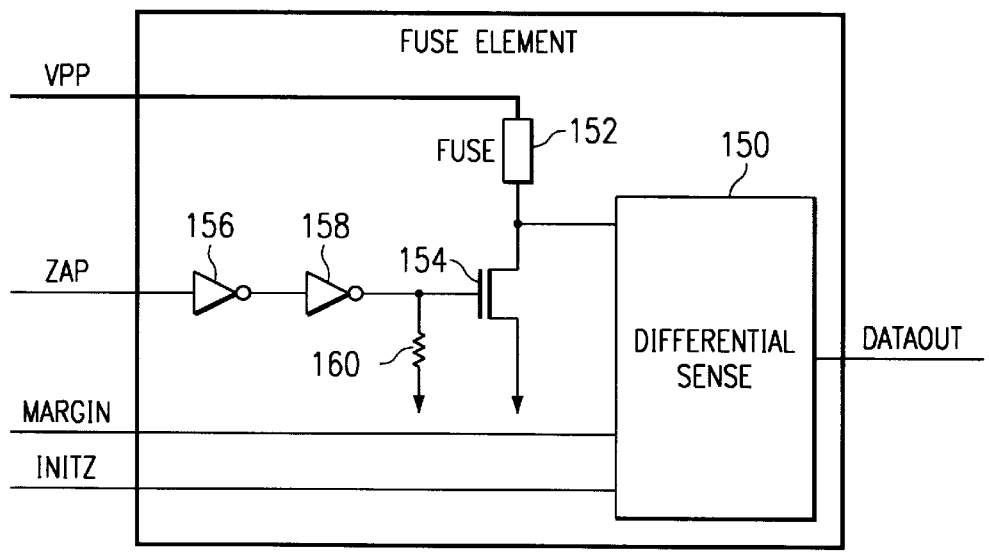
FIG. 7 illustrates a schematic diagram of a fuse element in accordance with the present invention.

FIG. 7 illustrates exemplary component parts of the fuse element 100. The fuse element 100 includes a pair of inverters 156 and 158 coupling a ZAP signal to the gate of a field effect transistor 154. A pull down resistor 160 pulls the gate of the field effect transistor to ground when the ZAP signal is low. A fuse 152 is located between the power source (VPP) and the drain of transistor 154, and the source of the transistor 154 is coupled to ground. An output signal is connected from the drain of the transistor 154 to a differential sense amplifier 150 to determine whether or not the fuse 152 has been blown. The input signal MARGIN and INITZ are also coupled to the differential sense amplifier 150. An output from the differential sense amplifier 150 is provided (DATAOUT) that indicates whether or not the fuse element has been programmed (i.e. the fuse has been blown). Preferably, the INITZ signal disables all current paths when it is inactive high. When the INITZ signal is active low, it prevents accidental programming of the fuse during transient conditions (e.g. power up/down). When the MARGIN signal is active, this causes the sense circuit to read in margin mode while sense is active. The ZAP signal causes the fuse element to be programmed when it is active high. The ZAP signal must remain active until the fuse is programmed. The DATAOUT signal is the output of the fuse element. It reflects the value of the fuse element when the sense circuit 150 is active. The sense circuit 150 is active during initialization modes only and may sense the margin state of the fuse if MARGIN is active high. After initialization is complete, the data or margin data may be read out in read mode.

Figure 8A:
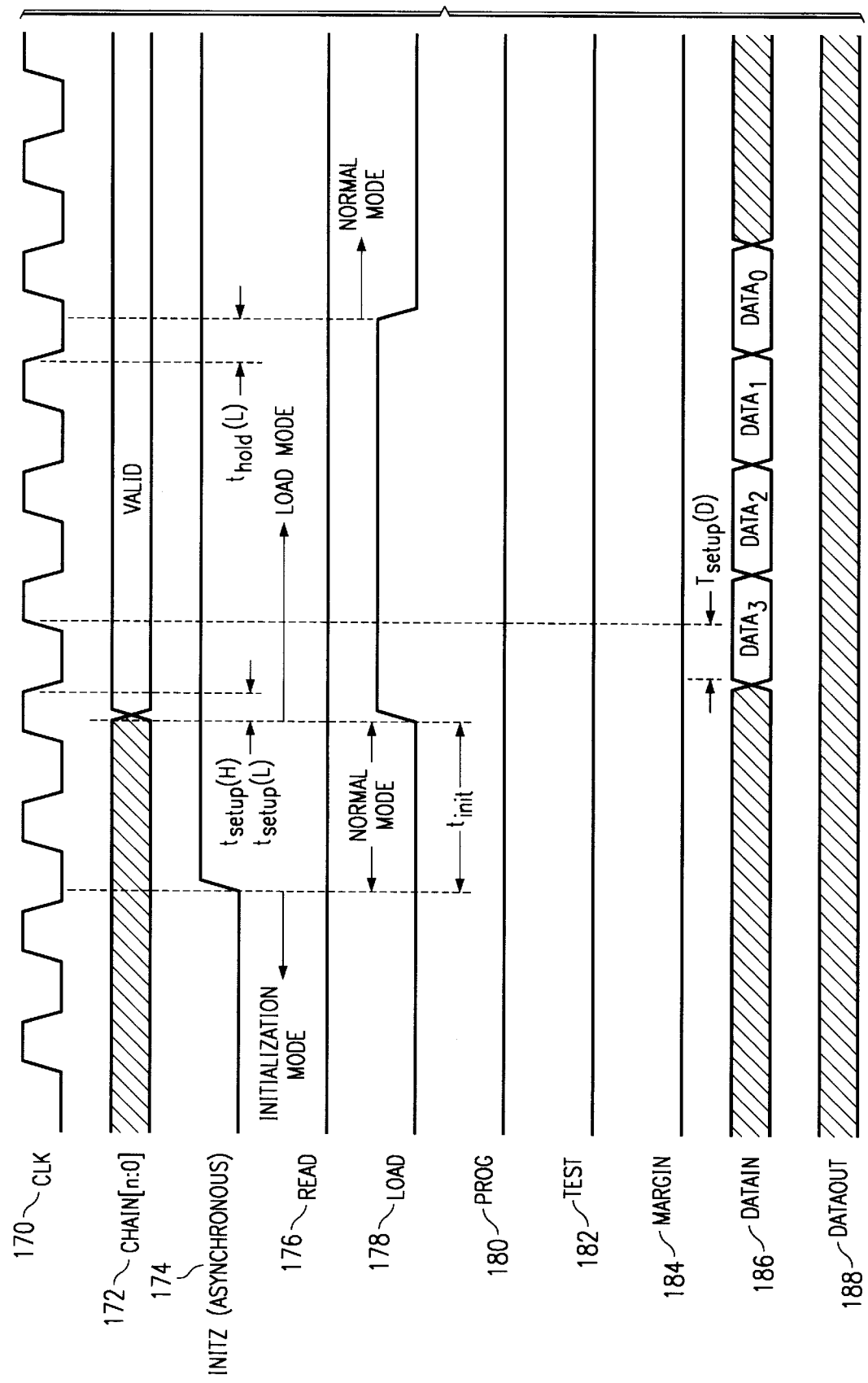
FIG. 8a illustrates a timing diagram for loading a fuse chain in accordance with one aspect of the present invention.

FIGS. 8a–8d illustrate timing diagrams of a typical operation of loading, testing, programming and reading of a fuse chain. Each figure includes the timing diagrams for the following signals: CLK 170, CHAIN[n:0] 172, INITZ 174, READ 176, LOAD 178, PROG 180, TEST 182, MARGIN 184, DATAIN 186, and DATAOUT 188. FIG. 8a illustrates a serial data load operation of a fuse chain or sub-chain in accordance with the present invention. All storage elements in a fuse chain are initialized when INITZ 174 is active low. During initialization, the sense circuit 150 in all fuse elements 100 become active and the fuse element's logic value is propagated to an internal latch for capturing upon release of INITZ 174 entering the normal mode. In normal operation each fuse cell's output is available to a host device with the fuse implementation requiring only leakage power. This is achieved by using a transparent latch circuit 98 to capture the fuse element's logic state upon the release of INITZ 174.

After INITZ becomes active high causing the fuse cells of the chain or sub-chain to enter the normal mode, the chain or sub-chain can be loaded with data during a load operation. A load operation consists of the serial loading of data into each fuse cell in a chain or sub-chain. The load operation loads data into each cell by propagating the data from one cell to the other through the data shift registers 90 of each fuse cell. The load operation is activated when LOAD 178 is active high following the release of INITZ 174. Once the load operation becomes active, CLK 170 is gated to the DATACLK of the addressed chain (See e.g., FIGS. 3a and 3b). A valid chain address CHAIN[n:0] 172 and a valid data signal DATAIN 186 is provided upon activation (high) of the LOAD signal 178 for the necessary number of clock pulses CLK 170, corresponding to the number of elements in the chain. Each rising edge of CLK 170 following the release of INITZ 174 causes the input data on DATAIN 186 to be propagated into the fuse chain through the data registers 90. A data value must be loaded for each fuse or protection cell in the chain. If previously programmed portions of a chain are to have their data preserved then 0's should be loaded for those portions. A logic '1' is typically a request for a fuse to be programmed and a logic '0' typically causes no change in the state of the fuse. Once an optional program protection cell 70 becomes programmed and the fuse implementation initialized, it will no longer propagate logic '1's downstream. After the data is serially loaded into the fuse chain, the chain or sub-chain will return to normal operation with the LOAD signal 178 going low.

Figure 8B:
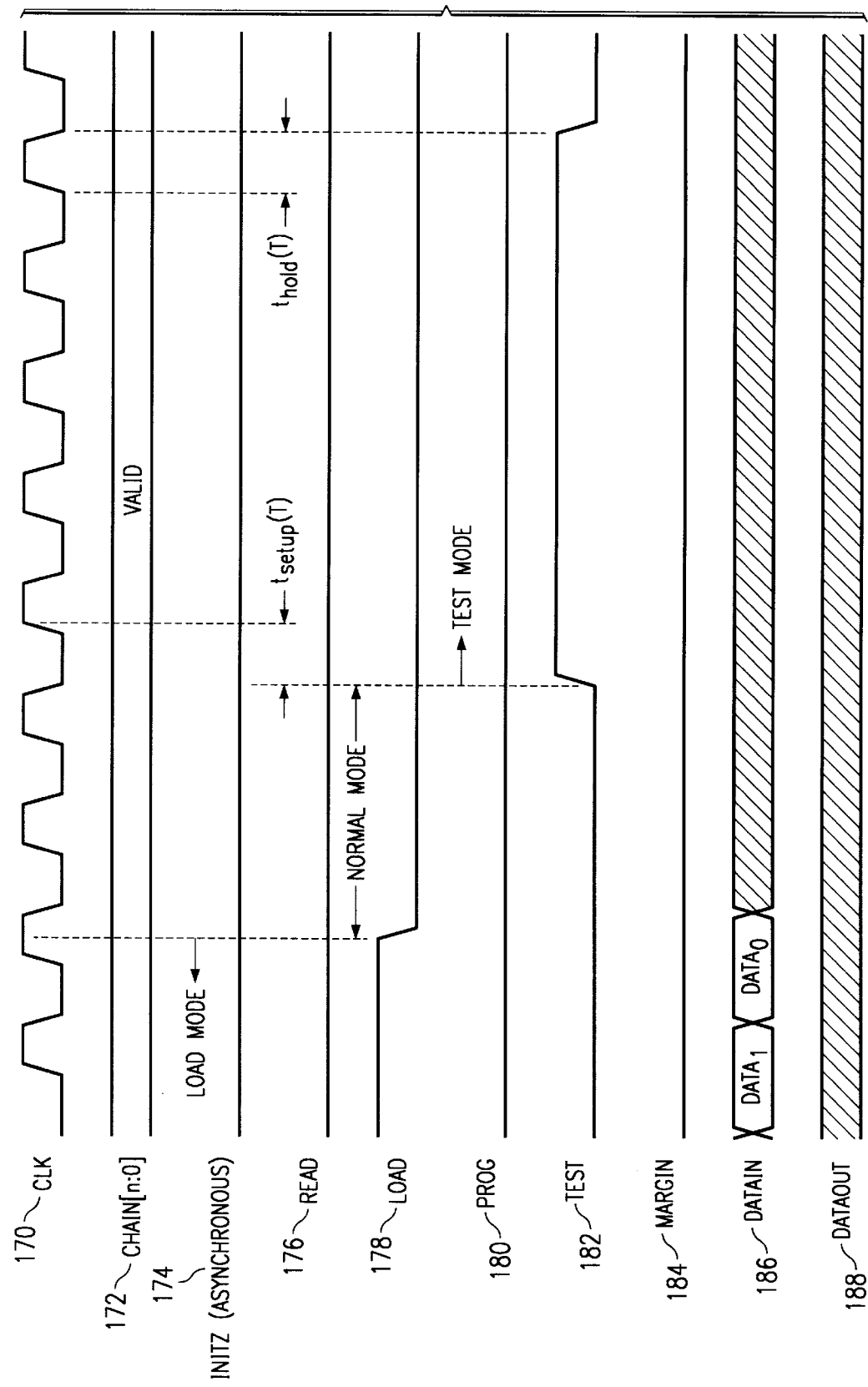
FIG. 8b illustrates a timing diagram for testing a loaded fuse chain in accordance with one aspect of the present invention.

FIG. 8b illustrates a soft test operation of a fuse chain or sub-chain in accordance with the present invention. Soft test is used to test the desired fuse values before they are permanently programmed into the fuse elements. This operation can be performed after a load operation has been completed for testing the values loaded of the addressed chain only. The soft test operation is particularly useful in applications where multiple patterns may be loaded to find an optimum solution without requiring additional test circuitry. An example is an analog trimming device in which several patterns could be loaded and tested with the optimum finally captured and programmed in the fuses. Similarly, if multiple redundant elements associated with redundant memory elements are tested before coming to final programming the memory yield can be optimized. Referring back to FIG. 8b, a load operation on a chain or sub-chain is being completed indicated by the first dash line and the arrow pointing to Load Mode. The LOAD signal 178 is deactivated returning the chain or sub-chain to normal mode. The loaded values in the fuse chain or sub-chain can now be read by a soft test operation. The soft test operation is activated when TEST 182 is active high, while INITZ 174 remains active high. A valid chain address CHAIN[n:0] 172 is provided, while the TEST 182 signal is high for the necessary number of clock pulses CLK 170, corresponding to the number of elements loaded in the chain. The data loaded into the data shift registers 90 is propagated to the PDATAOUT signal of the last fuse cell in the chain or sub-chain.

FIG. 8c illustrates a program or write operation of a fuse chain or sub-chain in accordance with the present invention. The program mode can be entered following a load operation to program the loaded data into the addressed chain. After the loading of the data, when program mode is entered, a single enable pulse propagates along the program registers 92 of the fuse and protection cells via the CELLIN signal in the addressed fuse chain with each rising edge of CLK 170. The cell with the active enable signal is defined as the active cell. If enable is active on a fuse or protection cell and the fuse is desired to be programmed then the current path that causes the fuse to be programmed is enabled. Referring back to FIG. 8c, a load operation on a chain or sub-chain is being completed indicated by the first dash line and the arrow pointing to Load Mode. The LOAD signal 178 is deactivated returning the chain or sub-chain to normal mode. The loaded values in the fuse chain or sub-chain can now be programmed into the fuse cells by a program operation. The program operation is activated when PROG 180 is active high, while INITZ 174 remains active high. A valid chain address CHAIN[n:0] 172 is provided, while the PROG 180 signal is high for the necessary number of clock pulses CLK 170, corresponding to the number of elements loaded in the chain. The programming of a fuse element occurs very quickly after the rising edge of the signal enabling the program operation.

FIG. 8d illustrates a read operation of a fuse chain in accordance with the present invention. A read operation causes the programmed values of the fuses to be serially propagated through the fuse chain or sub-chain via the program register 92 and the multiplexer 94. A read operation is activated when READ 176 is active high following the release of INITZ 174 and the loading of the fuse or protection cell data through the data registers 92. This can be accomplished by activating the TEST signal 182 for one or more clock cycles causing the fuse cell programmed value to be loaded into the program register 92 of each of the fuse cells in the chain or sub-chain. The read operation may then be performed. Once the READ signal 176 becomes active, CLK 170 is gated to the ENCLK of the addressed chain. Each rising edge of CLK 170 allows the chain data to be read sequentially in scan chain fashion through the program registers 92. The chain address should not be changed following the release of INITZ 174. A valid chain address CHAIN[n:0] 172 is provided, while the READ signal 176 is high for the necessary number of clock pulses CLK 170, corresponding to the number of elements loaded in the chain.

Figure 9A:
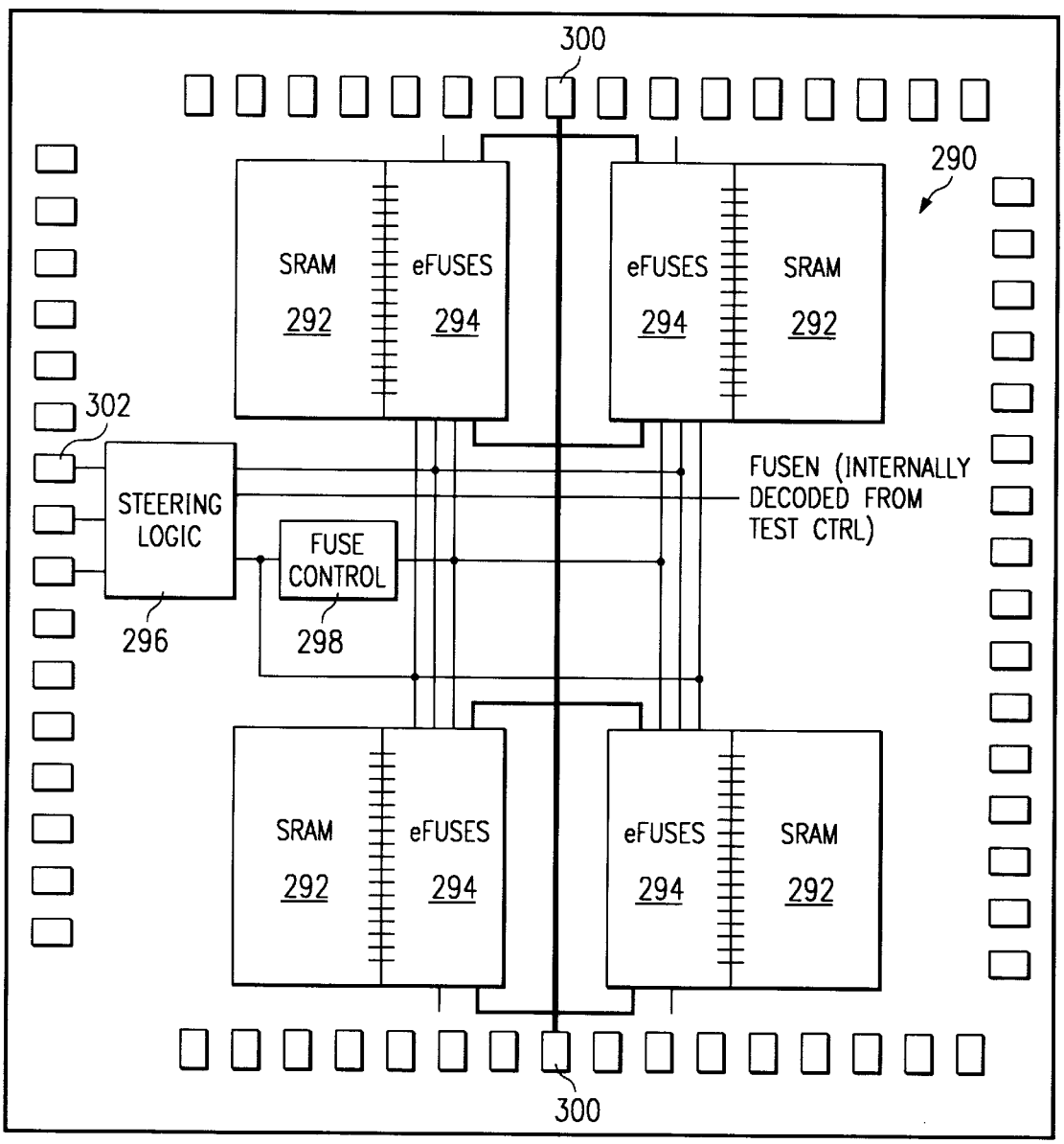
FIG. 9a illustrates a memory device implementing fuse chains in accordance with one aspect of the present invention.
Figure 9B:
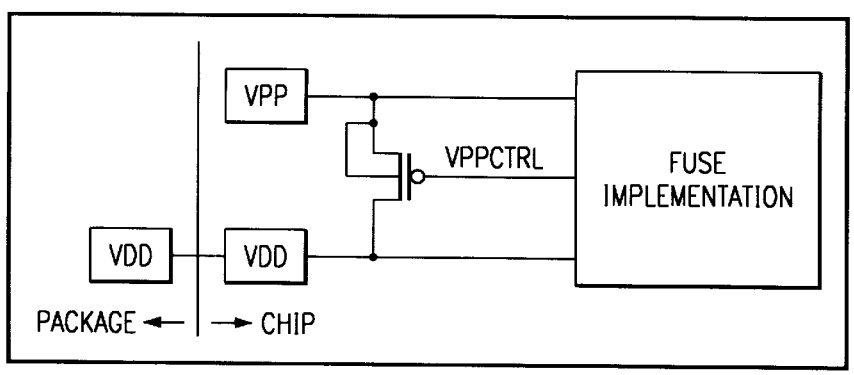
FIG. 9b illustrates the circuit required to provide a supply to VPP when VPP is not bonded in a package.

FIG. 9a illustrates an example of an implementation of the present invention within a memory device 290. The memory device 290 includes four 1-Megabit SRAM blocks 292 each being provided with an electrically programmable fuse block 294. Each of the SRAM's fuse blocks are implemented as a chain which is connected to a fuse control block 298. The FUSEOUT output signals of the fuse cells in the fuse chain are used by the SRAM for redundancy control. Each fuse chain preferably contains a leading program (write) protection cell and a trailing optional read protection cell. The memory device 290 includes two VPP pads 300 for high current programming of the fuse cells. It is to be appreciated that VPP can be made available as a pin on the device after the device is packaged or VPP can be made available at the wafer level. The circuit shown in FIG. 9b shows a method of providing power to the VPP pin when VPP is not bonded in a package. It contains a pMOS transistor which is normally closed (controlled by VPPCTRL from the control block). The pMOS switch is opened during programming when the voltage on VPP is typically higher than VDD. Programming of the fuse blocks 294 can be accomplished by providing the following implementation signals: CLK, DATAIN, DTAOUT, CHAIN[n:0], READ, LOAD, INITZ, PROG, MARGIN and TEST, details of which have been already discussed. The implementation signals can be routed to the fuse blocks 294 by a steering logic device 296 when a signal TCR 302 is active as decoded by the steering logic device 296.

FIG. 10 is a flow diagram illustrating one particular methodology for programming a fuse chain with read protection according to the present invention. In step 210, the control logic and fuse chain is initialized. In step 220, the fuse chain is loaded with data by shifting data through the data registers 90 of each fuse and optional protection cell. In step 230, the circuit which uses the fuse chain outputs is tested to ensure that the appropriate values have been loaded. In step 240, the fuse chain is programmed with the appropriate values by propagating a high bit through the enable registers 92 programming (one bit at a time with the high bit) the appropriate data values that have been loaded in each respective data register 90. In step 250, the programmed data is read from the fuse chain. In step 260, the desired read protection cells are loaded. Finally, in step 270, the read protection cells are programmed by propagating a high bit to the enable registers 92 of the read protection cells. It is to be appreciated that the read protection cells can be loaded and programmed with the fuse chain, but this would prohibit reading of the programmed values of the preceding fuse cells in the fuse chain.

FIG. 11 is a flow diagram illustrating one particular methodology for programming a fuse chain with write protection according to the present invention. In step 310, the control logic and fuse chain is initialized. In step 320, the fuse chain is loaded with data by shifting data through the data registers 90 of each fuse cell. In step 330, the circuit which uses the fuse chain outputs is tested to ensure that the appropriate values have been loaded. In step 340, the fuse chain is programmed with the appropriate values by propagating a high bit through the enable registers 92 programming (one bit at a time with the high bit) the appropriate data values that have been loaded in each respective data register 90. In step 350, the programmed data is read from the fuse chain. In step 360, the desired write protection cells are loaded. Finally, in step 370, the write protection cells are programmed by propagating a high bit to the enable registers 92 of the read protection cells. It is to be appreciated that the write protection cells can be loaded and programmed with the fuse chain, but this would prohibit further writing into subsequent fuse cells in the fuse chain.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such features may be combined with one or more other features of the other embodiments as may be desired and advantageous for any given or particular application.

What is claimed is:

1. An electronic system, comprising:
   an electronic device; and
   a fuse chain integrated into the electronic device, the fuse chain comprising:
   at least one write protection fuse cell;
   at least one read protection fuse cell; and
   at least one data fuse cell operably coupled to the protection fuse cell, wherein the fuse chain is selectively programmable by loading serial data into the fuse chain and wherein the fuse chain is adapted to be serially loaded and serially tested prior to programming of the fuse chain.

2. The system of claim 1, wherein programming of the write protection fuse cell prohibits further serial programming of downstream bits in the fuse chain.

3. The system of claim 1, wherein the programmed data of the fuse chain can be read serially beginning with the fuse or protection cells following the programmed read protection fuse cell.

4. The system of claim 1, wherein programming of the read protection fuse cell prohibits serial reading of preceding cells in the fuse chain.

5. The system of claim 1, wherein each of the at least one data fuse cells includes an output accessible by the electronic device.

6. The system of claim 1, further including a control logic circuit operatively coupled to the fuse chain and adapted to generate control signals to program the fuse chain with a data value.

7. The system of claim 6, wherein the control logic circuit is further adapted to generate control signals to load the data values into the fuse chain prior to programming.

8. The system of claim 7, wherein the control logic circuit is further adapted to generate control signals to test the data values loaded into the fuse chain prior to programming.

9. The system of claim 6, wherein the control logic circuit is further adapted to generate control signals to read the data value programmed into the fuse chain.

10. The system of claim 6, further including a plurality of additional fuse chains, wherein each fuse chain includes a specific address and the control logic circuit is adapted to address and program each of the fuse chains individually.

11. The system of claim 1, wherein the electronic device is one of a memory device and an analog device.

12. A method for storing a data value, comprising the steps of:
   providing a fuse chain including at least one write protection fuse cell, at least one read protection fuse cell, and at least one data fuse cell;
   loading a data value serially into the fuse chain;
   testing the data value serially in the fuse chain; and
   programming the loaded data value into the chain.

13. The method of claim 12, wherein the step of loading includes loading a data value with a program bit that causes a fuse element in the write protection cell to be programmed in the step of programming such that the write protection fuse cell prohibits programming of subsequent cells in the chain.

14. The method of claim 12, wherein the step of loading includes loading a data value with a program bit that causes a fuse element in the read protection cell to be programmed in the step of programming, such that the read protection fuse cell prohibits reading of preceding fuse cells in the chain.

15. The method of claim 12, wherein the step of providing a chain further includes providing an output readable by a system hosting the chain for each of the at least one data fuse cells.

16. The method of claim 12, wherein each fuse cell including a data shift register element, a program enable shift register element and a fuse element wherein the data shift registers of each fuse cell are electrically coupled serially and the program enable shift registers of each fuse cell are electrically coupled serially.

17. The method of claim 16, wherein the step of programming includes propagating an enable bit serially through the program enable shift registers of each fuse cell causing fuse cells having a program bit in their respective data shift register to program their respective fuse element one at a time.

* * * * *